(12) United States Patent
Ichiki

(10) Patent No.: US 6,423,480 B2
(45) Date of Patent: Jul. 23, 2002

(54) REMOVER COMPOSITION

(75) Inventor: Naoki Ichiki, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/742,085

(22) Filed: Dec. 22, 2000

(30) Foreign Application Priority Data

Dec. 27, 1999 (JP) ............................................. 11-370694

(51) Int. Cl.$^7$ ............................. G03F 7/42; C11D 17/08; C03C 23/00; C03G 1/00
(52) U.S. Cl. ..................... 430/329; 430/331; 510/176; 510/175; 548/317.5; 134/2
(58) Field of Search ................................. 430/331, 329; 510/176, 175; 548/317.5; 134/2

(56) References Cited

U.S. PATENT DOCUMENTS

| | | | | |
|---|---|---|---|---|
| 3,112,156 A | * | 11/1963 | Vail et al. ................. | 548/317.5 |
| 3,260,565 A | * | 7/1966 | Beachem ................. | 548/317.5 |
| 3,903,033 A | * | 9/1975 | Chao ........................ | 548/317.5 |
| 4,332,586 A | * | 6/1982 | North ....................... | 548/317.5 |
| 4,650,877 A | * | 3/1987 | Mabire et al. ............ | 548/317.5 |
| 4,770,668 A | * | 9/1988 | Skoultchi et al. ........ | 548/317.5 |
| 4,997,748 A | * | 3/1991 | Takeda et al. ............. | 430/331 |
| 5,110,944 A | * | 5/1992 | Yamada et al. ........... | 548/317.5 |
| 5,507,978 A | * | 4/1996 | Honda ........................ | 430/331 |
| 5,795,702 A | * | 8/1998 | Tanabe et al. .............. | 430/331 |
| 6,103,898 A | * | 8/2000 | Kramer et al. ........... | 548/317.5 |
| 6,140,027 A | * | 10/2000 | Baik et al. .................. | 510/176 |
| 6,238,849 B1 | * | 5/2001 | Marsella et al. ............ | 430/331 |

FOREIGN PATENT DOCUMENTS

| | | |
|---|---|---|
| JP | 59-49539 A | 3/1984 |
| JP | 64-42653 A | 2/1989 |
| JP | 2-131239 A | 5/1990 |
| JP | 4-350660 A | 12/1992 |
| JP | 6-12455 B2 | 2/1994 |
| JP | 8-334905 A | 12/1996 |

* cited by examiner

Primary Examiner—Richard L. Schilling
(74) Attorney, Agent, or Firm—Birch, Stewart, Kolasch & Birch, LLP

(57) ABSTRACT

A remover composition obtained by adding 1 to 90% by weight of a cyclic urea compound represented by the following general formula (I):

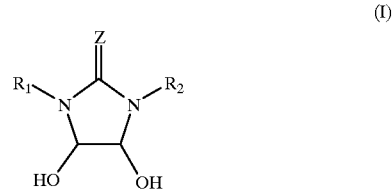

wherein, each of $R_1$ and $R_2$ independently represents a hydrogen atom, hydroxyl group, carboxyl group or alkyl group which may be substituted, and Z represents an oxygen atom or sulfur atom.

12 Claims, No Drawings

REMOVER COMPOSITION

BACKGROUND OF THE INVENTION

1. Field of the Invention

The present invention relates to a remover composition. More particularly, the present invention relates to a remover composition used for removing photoresists and residues in a process of producing a semiconductor element.

2. Description of the Related Art

Recently, formation of finer patterns having high precision is required with development of integrated circuits having higher density, consequently, a dry etching method using a halogen-based gas is frequently used as an etching method instead of a conventional chemical etching method, and further, treatments such as ashing by oxygen plasma, ion implantation and the like are conducted.

By such a dry etching method, ashing treatment and the like, a photoresist film is oxidized by a halogen-based etching gas, oxygen or the like, as a result, the photoresist film having organic film like property is converted to that having inorganic film like property, further, by an ion implantation treatment, the film gets poor solubility.

A remover composition is used to remove photoresists and residues after dry etching remaining on the surface parts of wiring layers and insulation film layers, side wall parts of wiring layers and bottom parts of via hole produced in forming wiring layers of a conductive metal and via hole.

Conventionally, there are used, as a remover composition, mixed solutions of organic alkalis, inorganic alkalis, organic acids, inorganic acids, and polar organic solvents, or aqueous solutions thereof, and for example, JP-A No. 59-49539 discloses a remover composed of a 2-pyrrolidinone compound and a dialkylsulfone compound, JP-A No. 4-350660 discloses a remover composed of 1,3-dimethyl-2-imidazolidinone and dimethylsulfoxide, and JP-B No. 6-12455 discloses a remover composed of an alkanolamine with a sulfonic compound and glycol monoalkyl ether, and the like.

Further, with development of semiconductor elements having finer structures, corrosion of a metal film used in a wiring layer is also a problem in a process for removing resists and a process for removing residues after dry etching. When a metal film used in a wiring layer is corroded, resistance increases, and problems occur such as increase in power consumption, heat generation from a semiconductor element, and the like.

However, the conventional remover composition as described above has problems that an ability thereof to remove resists and residues after dry etching is still insufficient, a metal film used in a wiring layer is corroded, and the like.

Therefore, a remover composition which has further higher removing ability and in which corrosion of a metal film used in a wiring layer does not occur easily is desired.

SUMMARY OF THE INVENTION

An object of the present invention is to provide a remover composition which causes extremely low corrosion of materials such as an insulation film, metal film and the like constituting a semiconductor element in a process of producing the semiconductor element, and has a high ability to remove residues and photoresists formed in producing the semiconductor element by solving the above-mentioned problems.

The present inventors have intensively studied a removing composition having no above-described problems, and resultantly, found that a removing composition obtained by adding a cyclic urea compound having a specific structure has extremely low corrosive effect on materials such as an insulation film, metal film and the like and has a high ability to remove residues and photoresists formed in producing a semiconductor element, and have completed the present invention.

Namely, the present invention relates to [1] a remover composition obtained by adding 1 to 90% by weight of a cyclic urea compound represented by the following general formula (I):

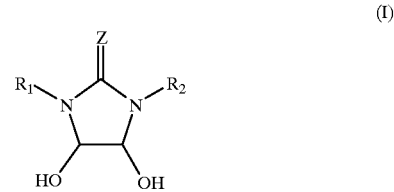

wherein, each of $R_1$ and $R_2$ independently represents a hydrogen atom, hydroxyl group, carboxyl group or alkyl group which may be substituted, and Z represents an oxygen atom or sulfur atom.

Also, the present invention relates to [2] a remover composition containing 1 to 90% by weight of a cyclic urea compound represented by the general formula (I).

Further, the present invention relates to [3] a process for removing a photoresist by using the above-mentioned remover composition [1], and [4] a process for removing a residue formed in producing a semiconductor by using the above-mentioned remover composition [1].

DETAILED DESCRIPTION OF THE PREFERRED EMBODIMENTS

The present invention will be illustrated in detail below.

The remover composition of the present invention is obtained by adding 1 to 90% by weight of a cyclic urea compound of the general formula (I), or contains 1 to 90% by weight of a cyclic urea compound represented by the general formula (I). The additional amount or content of the cyclic urea compound is preferably from 10 to 40% by weight.

Specifically, the remover composition of the present invention is obtained by adding the above-mentioned cyclic urea compound to water and/or organic solvent, or comprises the above-mentioned cyclic urea compound in water and/or organic solvent.

Namely, the remover composition of the present invention is obtained by adding a cyclic urea compound of the general formula (I) to water and/or water-soluble organic solvent in an amount of 1 to 90% by weight, or contains a cyclic urea compound of the general formula (I) in water and/or water-soluble organic solvent in an amount of 1 to 90% by weight. The additional amount or content of the cyclic urea compound is preferably from 10 to 60% by weight, particularly preferably from 10 to 40% by weight.

When the concentration is less than 1% by weight, removing property on a photoresist and etching residue is insufficient. While, when over 90% by weight, removing property on an etching residue is insufficient.

In a cyclic urea compound of the general formula (I) in the present invention, each of $R_1$ and $R_2$ independently represents a hydrogen atom, hydroxyl group, carboxyl group or alkyl group which may be substituted. Z represent an oxygen atom (O) or sulfur atom (S).

When $R_1$ and $R_2$ are an alkyl group which may be substituted, groups represented by the following general formula (II):

$$—(CH_2)_n—X \qquad (II)$$

wherein, n represents an integer of 1 or more. X represents hydrogen, hydroxyl group, methoxy group or ethoxy group, are listed, independently, for $R_1$ and $R_2$.

Preferable $R_1$ and $R_2$ represent a hydrogen atom or an alkyl group which may be substituted of the general formula (II), and n represents preferably from 1 to 4, particularly preferably from 1 to 2, from the standpoint of a sufficient ability on removing property of a photoresist and etching residue. Further, it is preferable that $R_1=R_2$.

Examples of an cyclic urea compound of the general formula (I) include 4,5-dihydroxy-2-imidazolidinone, 4,5-dihydroxy-1,3-dimethyl-2-imidazolidinone, 4,5-dihydroxy-1,3-bis(hydroxymethyl)-2-imidazolidinone, 4,5-dihydroxy-1,3-bis(methoxymethyl)-2-imidazolidinone and the like.

Examples of an organic solvent in the present invention include alcohols such as methanol, ethanol, n-propyl alcohol, isopropyl alcohol, n-butanol, n-butyl alcohol, pentanol, ethylene glycol, glycerin and the like; amides such as N-methylformamide, N,N-dimethylformamide, N,N-dimethylacetamide, N-methyl-2-pyrrolidone and the like; lactones such as γ-butyrolactone and the like; esters such as propyl acetate, butyl acetate, butyl propionate, ethyl butyrate, butyl butyrate, methyl lactate, ethyl lactate and the like; ketones such as acetone, methyl ethyl ketone, acetyl acetone, methyl butyl ketone, 3-pentanone, 2-heptanone and the like; ethers such as diethyl ether, dipropyl ether, dibutyl ether, oxyrane, dioxane and the like; glycol monoethers such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monomethyl ether and the like; sulfolanes such as sulfolane and the like; sulfoxides such as dimethyl sulofxide and the like; urea compounds such as dimethylimidazolidinone and the like; hydrocarbons such as pentane, hexane, heptane, cyclohexane and the like; and other solvents. Among other, water-soluble organic solvents having solubility in water of 8% or more are preferable.

Examples of a water-soluble organic solvent in the present invention include alcohols such as methanol, ethanol, n-propyl alcohol, isopropyl alcohol, ethylene glycol, glycerin and the like; amides such as N-methylformamide, N,N-dimethylformamide, N,N-dimethylacetamide, N-methyl-2-pyrrolidone and the like; lactones such as γ-butyrolactone and the like; esters such as methyl lactate, ethyl lactate and the like; ketones such as acetone, methyl ethyl ketone, acetyl acetone and the like; ethers such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monomethyl ether and the like; sulfolanes such as sulfolane and the like; sulfoxides such as dimethyl sulofxide and the like; urea compounds such as dimethylimidazolidinone and the like; and other solvents. Further preferably, N-methyl-2-pyrrolidone, methanol, dimethylsulfoxide and the like are listed. These water-soluble organic solvents may be used alone or in combination thereof.

It is preferable that a remover composition of the present invention further contains an organic amines. Regarding ratio thereof, a remover composition comprises a remover composition which is obtained by adding a cyclic urea compound of the above-described general formula (I) into water and/or water-soluble organic solvent in an amount of 1 to 90% by weight, or which contains this cyclic urea compound in water and/or water-soluble organic solvent, in a ratio of 100 parts by weight, and organic amines preferably in a ratio of from 0.1 to 150 parts by weight, further preferably from 1.0 to 100 parts by weight, particularly preferably from 5.0 to 50 parts by weight.

When the ratio of the organic amines is over 150 parts by weight, corrosion may occur on a conductive metal and insulation film on a substrate, and when less than 0.1 part by weight, removing property on a resist and etching residue may be insufficient.

The organic amines are selected from the group consisting of alkanol amines and alkylammonium hydroxides. These organic amines may be used alone or in combination of two or more. As the above-mentioned alkanol amine, monoethanolamine, diethanlamine, triethanolamine, 2-(2-aminoethoxy)ethanol and the like are listed. As the above-mentioned alkylammonium hydroxide, tetramethylammonium hydroxide, tetraethylammonium hydroxide and the like are listed. These organic amines may be used alone or in combination of two or more.

It is preferable that a remover composition of the present invention contains additives. Further, it is preferable that a remover composition of the present invention contains additives in addition to the above-mentioned organic amines.

Regarding specific ratio thereof, a remover composition of the present invention comprises the above-mentioned remover composition, in a ratio of 100 parts by weight, and additives, in a ratio of from 0.001 to 100 parts by weight, preferably from 0.1 to 50 parts by weight, particularly preferably from 1.0 to 25 parts by weight. The abovementioned addition amount of additives is likewise applied to also a remover composition obtained by adding organic amines.

As the additive, reducing agents and chelating agents, particularly those having an effect as a corrosion inhibitor of metals can be used. For example, aromatic hydroxy compounds, triazole compounds and the like are listed. These may be used alone or in combination of two or more. When the concentration of the additive is over 100 parts by weight, the additive may remain on a substrate after remover treatment, while, when less than 0.001 part by weight, corrosion of a metal film on substrate may occur.

As the above-mentioned aromatic hydroxy compound, hydroquinone, catechol, resorcinol, pyrogallol and the like are listed, and of them, catechol is preferable. As the above-mentioned triazole compound, benzotriazole, carboxybenzotriazole, 1-hydroxybenzotriazole, 3-aminotriazole and the like are listed, and of them, benzotriazole is preferable. As other additives, polyethyleneimine, thioglycerol and the like can be listed. These compounds may be used alone or in combination thereof.

A remover composition of the present invention has extremely low corrosive effect on materials such as an insulation film and a metal film (made of aluminum, tungsten, copper, platinum and the like) constituting a semiconductor in a process of producing semiconductors such as a LSI element, liquid crystal panel and the like, and is suitable for copper or aluminum in particular.

A cyclic urea compound of the general formula (I) can be obtained by reacting corresponding urea compound or thiourea compound with glyoxal according to an ordinary method, or introducing an N-substituent into a reaction product ($R_1=R_2=H$ in the general formula (I)) of a urea compound or thiourea compound with glyoxal according to an ordinary method.

For obtaining a remover composition of the present invention, the above-mentioned compounds may advantageously be mixed in given amounts. The mixing method is not particularly restricted, and various known methods are applied.

A remover composition of the present invention has an excellent ability to remove a photoresist and a residue formed in conducting a dry etching treatment, and can suppress corrosion property on materials such as an insulation film, metal film and the like constituting a semiconductor element, consequently, can be suitably used in a process for cleaning semiconductor elements such as an LSI element, liquid crystal panel and the like.

In a process for removing a photoresist of the present invention, a photoresist is removed by using a remover composition of the present invention in a process of producing a semiconductor element.

In a process for removing a residue of a semiconductor element of the present invention, a residue formed in producing a semiconductor, particularly in a dry etching treatment is removed by using a remover composition of the present invention in a process of producing a semiconductor element.

The residue herein referred to means an ashing residue, etching residue, side-wall polymer and the like.

Specifically, for removing a resist and etching residue by using a remover composition of the present invention, for example, an LSI element and a liquid crystal panel element may advantageously be washed by a remover composition of the present invention using an immersion method or a spray washing method at a temperature in the range from 10 to 100° C.

EXAMPLES

The following examples will illustrate the present invention further in detail below, but do not limit the scope of the present invention.

Examples 1 to 4

On a substrate comprising a silicon wafer carrying thereon a first layer, silicon nitride ($Si_3N_4$) layer, a second layer, copper layer laminated on the first layer, and a third layer, insulation film (silicon oxide ($SiO_2$)) layer laminated on the second layer, via holes were formed according to dry etching by using a resist film as a mask, subsequently, the resist film was removed according to ashing by using oxygen plasma. Residues which could not be removed by oxygen plasma were present on the upper side parts of the insulation film, side wall parts of the via holes, and bottom parts of the via holes.

This wafer was immersed in a remover composition shown in Table 1 under treating conditions as shown in Table 2, and rinsed with ultrapure water and dried, and was observed by a scanning electron microscope (SEM). Removing property of the residues and corrosive effect on the copper layer were evaluated and the results are shown in Table 2. The evaluation criteria in the SEM observation are as follows.

(Removing Property)
 ◎: removed completely
 Δ: partial remaining was recognized
 X: most parts remained
(Corrosion Inhibitive Effect)
 ◎: corrosion was not recognized at all
 Δ: partial corrosion was recognized
 X: sever corrosion was recognized

TABLE 1

| | Compound of the formula (I) | | Water | | Water-soluble organic solvent | | Organic amines | | Additives | |
|---|---|---|---|---|---|---|---|---|---|---|
| No. | Kind | Parts by weight | Kind | Parts by weight | Kind | Parts by weight | Kind | Parts by weight | Kind | Parts by weight |
| Examples | | | | | | | | | | |
| 1 | A | 53.8 | Water | 38.5 | Methanol | 7.7 | MEA | 30.8 | Catechol | 23.1 |
| 2 | B | 34.6 | Water | 57.7 | Methanol | 7.7 | MEA | 30.8 | Catechol | 23.1 |
| 3 | B | 29.0 | Water | 34.8 | NMP | 36.2 | MEA | 29.0 | Catechol | 14.5 |
| | | | | | | | | | BTA | 1.4 |
| 4 | C | 53.8 | Water | 38.5 | Methanol | 7.7 | MEA | 30.8 | Catechol | 23.1 |

A remover composition of the present invention has an excellent ability to remove a photoresist and a residue formed in conducting a dry etching treatment, and has extremely low corrosive effect on materials such as an insulation film, metal film and the like constituting a semiconductor element, consequently, can be suitably used in a process for cleaning semiconductor elements such as an LSI element, liquid crystal panel and the like.

A: 4,5-dihydroxy-1,3-dimethyl-2-imidazolidinone
B: 4,5-dihydroxy-1,3-bis(hydroxymethyl)-2-imidazolidinone
C: 4,5-dihydroxy-1,3-bis(methoxymethyl)-2-imidazolidinone
MEA: monoethanolamine
NMP: N-methyl-2-pyrrolidone
BTA: 1,2,3-benzotriazole

TABLE 2

|  | No. | Treating conditions | | Removing property | Corrosive inhibitive effect |
|---|---|---|---|---|---|
|  |  | Temperature | Time (min.) |  |  |
| Examples | 1 | 70 | 20 | ◉ | ◉ |
|  | 2 | 70 | 20 | ◉ | ◉ |
|  | 3 | 70 | 20 | ◉ | ◉ |
|  | 4 | 70 | 20 | ◉ | ◉ |

What is claimed is:

1. A remover composition, comprising:
   100 parts by weight of a remover composition, wherein said remover composition is obtained by adding 1 to 90% by weight of a cyclic urea compound, to water, water-soluble organic solvent, or water and water-soluble organic solvent, said cyclic urea compound represented by the following general formula (I):

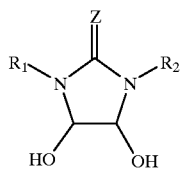

(I)

wherein, each of $R_1$ and $R_2$ independently represents a hydrogen atom, hydroxyl group, carboxyl group or alkyl group which may be substituted, and Z represents an oxygen atom or sulfur atom; and
   0.001 to 100 parts by weight of additives, wherein the additives are selected from the group consisting of aromatic hydroxy compounds and triazole compounds.

2. A remover composition, comprising:
   100 parts by weight of a remover composition, wherein said remover composition is obtained by adding 1 to 90% by weight of a cyclic urea compound, to water, water-soluble organic solvent, or water and water-soluble organic solvent, said cyclic urea compound represented by the following general formula (I):

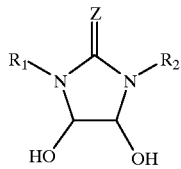

(I)

wherein, each of $R_1$ and $R_2$ independently represents a hydrogen atom, hydroxyl group, carboxyl group or alkyl group which may be substituted, and Z represents an oxygen atom or sulfur atom;
   0.1 to 150 parts by weight of organic amines; and
   0.001 to 100 parts by weight of additives, wherein the additives are selected from the group consisting of aromatic hydroxy compounds and triazole compounds.

3. A remover composition, comprising:
   100 parts by weight of a remover composition, wherein said remover composition comprises 1 to 90% by weight of a cyclic urea compound in water, water-soluble organic solvent, or water and water-soluble organic solvent, said cyclic urea compound represented by the following general formula (I):

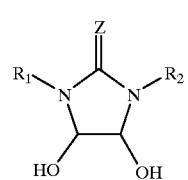

(I)

wherein, each of $R_1$ and $R_2$ independently represents a hydrogen atom, hydroxyl group, carboxyl group or alkyl group which may be substituted, and Z represents an oxygen atom or sulfur atom; and
   0.001 to 100 parts by weight of additives, wherein the additives are selected from the group consisting of aromatic hydroxy compounds and triazole compounds.

4. A remover composition comprising:
   100 parts by weight of a remover composition, wherein said remover composition comprises 1 to 90% by weight of a cyclic urea compound in water, water-soluble organic solvent, or water and water-soluble organic solvent, said cyclic urea compound represented by the following general formula (I):

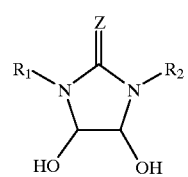

(I)

wherein, each of $R_1$ and $R_2$ independently represents a hydrogen atom, hydroxyl group, carboxyl group or alkyl group which may be substituted, and Z represents an oxygen atom or sulfur atom;
   0.1 to 150 parts by weight of organic amines; and
   0.001 to 100 parts by weight of additives, wherein the additives are selected from the group consisting of aromatic hydroxy compounds and triazole compounds.

5. The remover composition as in any one of claims 1, 2, 3, or 4, wherein said additive is catechol.

6. The remover composition as in any one of claims 1, 2, 3, or 4, wherein said additive is benzotriazole.

7. A process for removing a photoresist by using a remover composition according to claim 1.

8. A process for removing a residue of a semiconductor element, wherein a residue formed in producing semiconductor is removed by using a remover composition according to claim 1.

9. The process for removing a residue of a semiconductor element according to claim 8, wherein the residue formed in producing semiconductor is the residue formed by a dry etching treatment.

10. A process for removing a photoresist by using a remover composition according to claim 3.

11. A process for removing a residue of a semiconductor element, wherein the residue formed in producing semiconductor is removed by using a remover composition according to claim 3.

12. The process for removing a residue of a semiconductor element according to claim 11, wherein the residue formed in producing semiconductor is the residue formed by a dry etching treatment.

* * * * *